United States Patent [19]

Rahimzad

[11] Patent Number: 4,644,540
[45] Date of Patent: * Feb. 17, 1987

[54] DIAGNOSTIC METHOD FOR ADDRESSING ARRANGEMENT VERIFICATION

[75] Inventor: Antonio Rahimzad, Glendale, Ariz.

[73] Assignee: GTE Communication Systems Corporation, Phoenix, Ariz.

[*] Notice: The portion of the term of this patent subsequent to Jan. 13, 2004 has been disclaimed.

[21] Appl. No.: 661,011

[22] Filed: Oct. 15, 1984

[51] Int. Cl.⁴ .............................................. G06F 11/00
[52] U.S. Cl. ......................................... 371/16; 371/20
[58] Field of Search ................... 371/15, 16, 20, 22, 371/25; 324/73 R, 73 AT; 364/200

[56] References Cited

U.S. PATENT DOCUMENTS

| | | | |
|---|---|---|---|
| 4,025,906 | 5/1977 | Riikonen | 364/200 |
| 4,339,801 | 7/1982 | Hosaka | 371/20 |
| 4,398,299 | 8/1983 | Darling | 371/15 |
| 4,475,195 | 10/1984 | Carey | 371/16 |

Primary Examiner—Jerry Smith
Assistant Examiner—Robert W. Beausoliel, Jr.
Attorney, Agent, or Firm—Frank J. Bogacz; Peter Xiarhos

[57] ABSTRACT

This disclosure teaches a diagnostic method for finding faults in a unique addressing scheme. A telecommunications system controls external devices by operating control and sense point printed wiring cards. These printed wiring cards are organized to operate when selected by a processor. Two address components select the identity of a particular printed wiring card of a number of printed wiring cards to be operated. This invention detects any addressing apparatus which is permanently active, stuck to logic one. This method operates continuously to build a table of faulty equipment indications.

18 Claims, 4 Drawing Figures

DIAGNOSTIC METHOD FOR ADDRESSING ARRANGEMENT VERIFICATION

BACKGROUND OF THE INVENTION

The present invention pertains to a method of verification of a decoding and enabling arrangement and more particularly to a method for diagnosing a unique addressing arrangement.

Modern microprocessors are applied to a number of real time applications which involve the controlling and sensing of external devices. These microprocessors need to control a number of distinct events. Control points and sense points provide this function of interfacing microprocessor to such real time tasks as telecommunication systems. Since telecommunications systems provide their services for many thousands of people, great numbers of sense points and control points are required for the microprocessors to perform these switching operations.

These control points and sense points must be grouped into manufacturable entities, with which a microprocessor may communicate. The microprocessor must have a scheme which allows for the manipulation of these sense points and control points. To accomplish this function addressing schemes are commonly employed. These addressing schemes require decoding addresses supplied by the microprocessor in order to operate each one of these sense and control points.

Verifying the integrity of the operation of these control and sense points is essential to the efficient operation of a modern telecommunications system.

The GTD-5-EAX, which employs the present invention, utilizes a unique bussing arrangement for communicating with these control points and sense points. Diagnosing faults in a bussing arrangement is typically accomplished by repeated access to the equipment setting a particular bit and verifying that this particular bit is returned to the microprocessor. This set bit (logic 1) is placed (stepped through) each of the possible bit positions in order to verify the operation of the control points and sense points. GTD-5-EAX is a central office telecommunications product manufactured by GTE Communications Systems Incorporated.

The traditional bit stepping approach is not effective to diagnose faults in the control points and sense points of the GTD5-EAX, because of its unique bussing arrangement.

SUMMARY OF THE INVENTION

A processing system operates a number of printed wiring cards (PWCs) which have sense points and control points. These sense and control points operate test circuity for line and trunk circuits. An addressing arrangement selectively enables the printed wiring cards and transmits data to and from a processor via a data bus. A diagnostic method determines the validity of the addressing arrangement by selecting a first PWC via two address components. This first PWC is a sense point PWC. It is read only PWC. A second PWC which has a different first address component and an identical second address component is tested. This test produces a valid or invalid test result.

Then the method selects a third PWC with the same first component and a second component increment by one from the first PWC for an invalid condition of the previous test. Then a forth PWC is tested. This PWC has an identical first address component and a second address component incremented by one from the second PWC. In response to an invalid condition of the previous test, this test provides a second valid or invalid test result.

For an invalid second test result, a fault indication is made for the second PWC and the second address component of the first address. For a valid second test result, the first address component of the first PWC is indicated as faulty. The above procedure is repeated for all the addresses using all the different first address component.

A fifth PWC which is a sense point PWC is selected. A sixth PWC address which has an identical first component and a second component incremented by one from the fifth PWC is tested. The third test produces a valid or invalid test result.

For an invalid test result of the third test. A seventh PWC is selected, which has a first address component incremented by one and a second component identical to said fifth address. A last test is made of an eighth PWC, which has an identical first address component and second component incremented by one from the seventh address. As a result, a valid or an invalid condition is produced.

For a valid condition of the last test, a fault indication is made of the sixth address and the first component of the fifth address. For an invalid last test, the second component of the fifth address is indicated as faulty. The above procedure is repeated for all addresses incrementing the second address component by one until all addresses are tested.

DESCRIPTION OF THE PREFERRED EMBODIMENT

Figure 1:
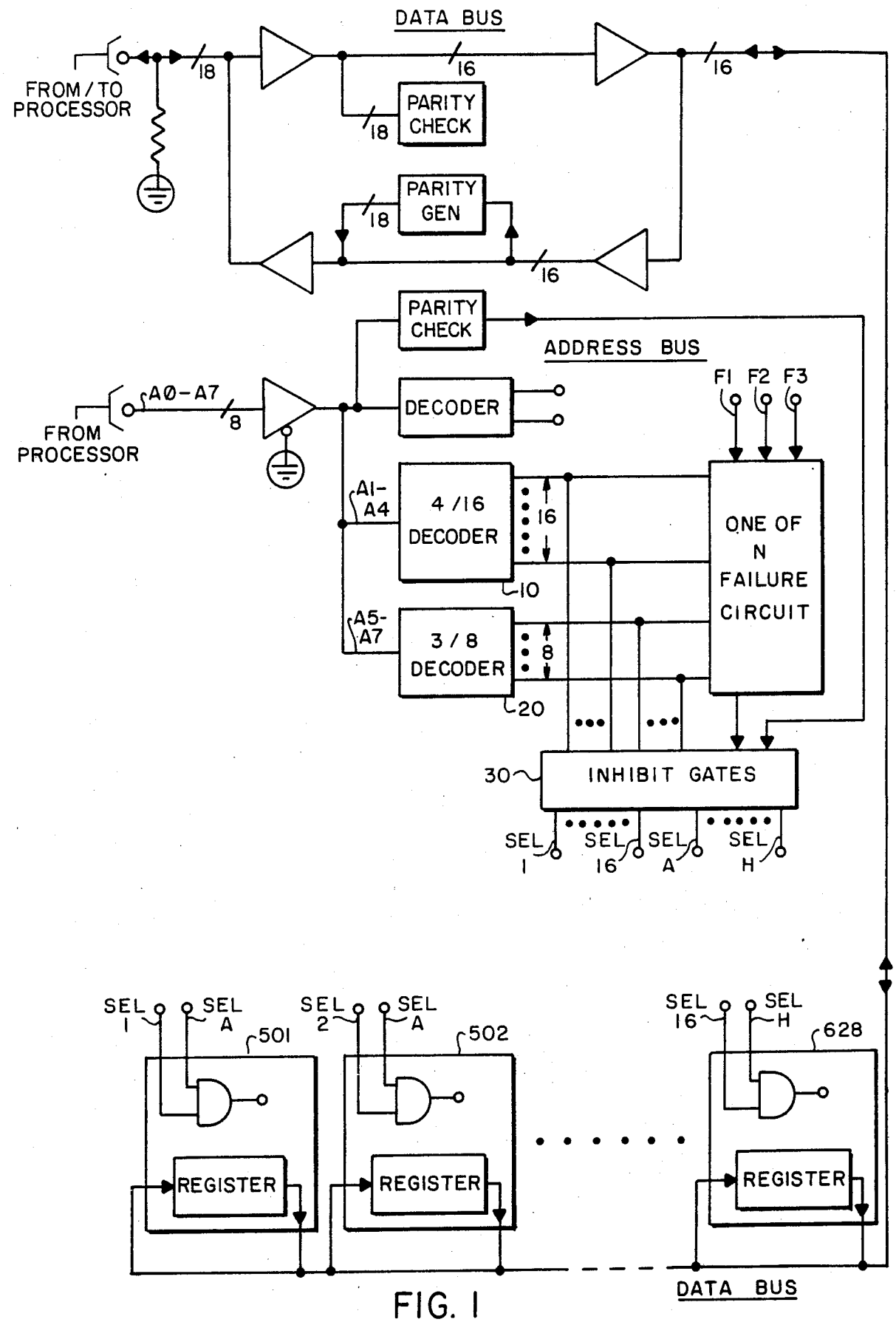
FIG. 1 is a schematic diagram of the bus structure connecting a CPU to a number of sense and control point printed wiring cards.

Referring to FIG. 1, a data bus and a address bus are shown connected between a processor and a number of printed wiring cards (PWCS) 501 through 628 which each contained a number of sense points and control points. These sense points and control points operate external circuitry such as special test circuits for line circuits and trunk circuits. The processor may comprise a microprocessor, such as an Intel 8086. Intel is a registered trademark of the Intel Corporation.

The data bus is 16 bits wide and contains 2 parity bits which are transmitted between the processor and the control point and sense point printed wiring cards 501 through 628. Parity is checked on data transmissions from the processor; and, parity is generated by this circuitry on data transmissions to the processor.

Eight bits of the address bus are used by the decoding circuitry to derive enable signals to enable specific ones of the printed wiring cards. Address bit A0 is used to derive control signals. Address bits A1 thru A4 are input to decoder 10. Decoder 10 produces numerical selects SEL1 thru SEL16. Address bits A5 thru A7 are input to decoder 20 which produces alphabetic selects SELA thru SELH.

Each of the numeric and alphabetic selects are gated through inhibit gates 30. Inhibit gates 30 may be activated to prevent transmission of any of the selects signals to the printed wiring cards. Transmission of the select signals may be inhibited, if a parity error is detected. In addition, a one of N check is performed on the decoded alphabetic and numeric selects to ensure that only one signal is decoded and that at least one is decoded. Should either of these tests fail inhibit gates 30 are activated, thereby blocking the select signals from the PWC's. Further, the one of N failure may be set for external testing purposes.

The alphabetic and numerics selects signals are connected in the following fashion to each of the printed wiring cards which contain the control points and sense points. Each printed wiring card has one alphabetic and one numeric select, which enable the operation of that particular printed wiring card. Each printed wiring card 501 through 628 contains an AND gate, which when activated enables the control point or sense point logic on the printed wiring card. Each printed wiring card further contains a register which is connected via the bidirectional data bus to the processor. This register provides for storing and controlling the control points and the sense points associated with each PWC. A logic one set in the register in a bit position corresponding to a control points will activate that control point. Similarly a logic zero inhibition bit position connected to a control point will deactivate that control point. Sense points from the external test, line and trunk circuitry are mapped into corresponding bit positions in the register and indicate that a particular function and activated or deactivated with logic 1 and logic 0 indications, respectively.

In this way, the processor can operate the special test circuits for the line and trunk circuitry by manipulating the control points and can sense the status of the line and trunk circuitry by reading the sense points.

Each printed wiring card is enabled by one alphabetic and numeric select. Printed wiring card 501 is enabled by alphabetic select SELA and numeric select SEL1; printed wiring card 502 is enabled by alphabetic select SELA and numeric select SEL2. Printed wiring card 628 is enabled by alphabetic select SELH and numeric SEL16. In this way, the control points and sense points may be operated and read by the processor to determine the status of the line and trunk circuits and to operate test circuits for the line and trunk circuits.

In order to diagnose faults in the select and bussing arrangements, two kinds of tests are required to made. First, it must be determined whether each printed wiring card is permanently inactive. That is, each printed wiring card must respond when the appropriate alphabetic and numeric selects are supplied. Second, it must be determined that only the printed wiring card which was selected responds, when given the particular alphabetic and numeric select signals. Failures may occur in the decoding logic, in the backplane wiring the bussing, which connects the decoding logic to the printed wiring cards, or the AND gate located on every PWC, which enable the circuiting of the PWC.

Figure 2:
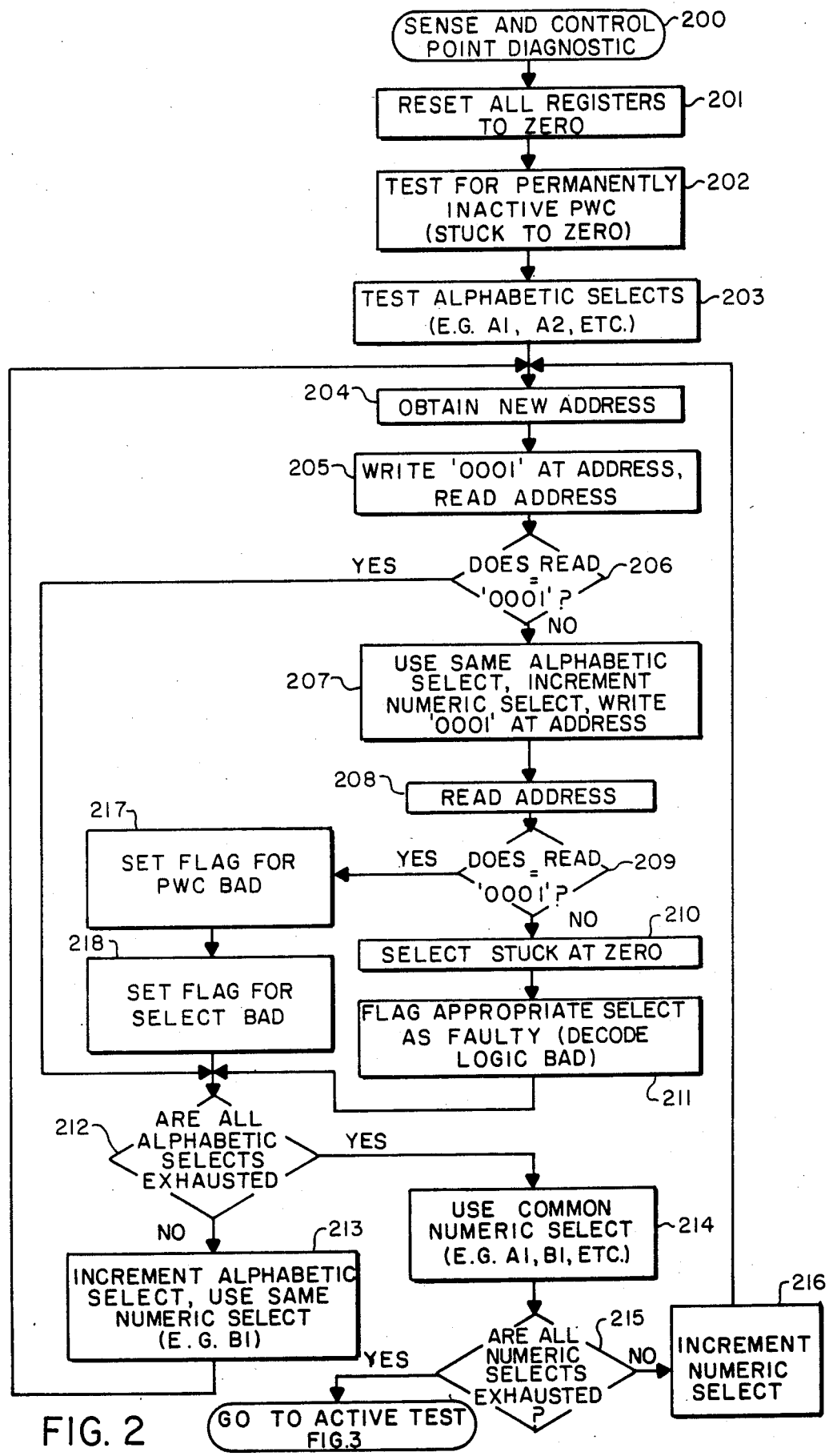
FIG. 2 is a logic diagram of the sense and control point diagnostic program.

Referring to FIG. 2, the sense and control point diagnostic 200 is entered. The register of each printed wiring card 501 through 628 is reset to zero block 201. The test for the inactive PWC is initiated block 202. The addressing is checked for any decodes which are stuck to 0. First the alphabetic selects are tested 203. Selects A1, A2, A3, B1, B2, B3, etc are checked first 203. A new address is obtained for use by the decoding logic 204. A logic '0001' is written at the address that was obtained. This address is then read back 205.

If the data which was read back is equal to logic '0001' 206, block 212 is executed next. If the data read back did not equal logic '0001' block 207 will retain the same alphabetic select but increment the numeric select and write logic '0001' at that address. This address will then be read 208. If the data read equals logic '0001', then transfer will be made to block 217. If the data read back did not equal logic '0001', then the common select is stuck at 0, block 210. Next, a flag will be set which will indicate this particular select as faulty 211.

Then, block 212 is entered, which determines whether all the alphabetic selects have been exhausted. If all the alphabetic selects have not been tested, block 13 will increment the alphabetic select and use the first numeric select. For example, if select A1 was being tested, control is then transferred to block 204 for another iteration. If all the alphabetic selects have been exhausted, block 214 is entered. Block 214 will test the numeric selects by using common alphabetic selects. If all the numeric selects are verified, block 215 is answered positively, the inactive test (stuck to 0) is complete and control is passed to the active test shown in FIG. 3. If all numeric selects have not been tested, then block 216 will increment the numeric select and transfer to block 204 to iterate the above process.

These diagnostics are continuously repeated, so the flags, that are kept in a software table, are constantly updated. When block 217 is entered, a flag will be set for a bad PWC, if on the last iteration on the diagnostic this address was also permanently inactive. If this last address, for example A2, had passed the test, before select one will be indicated as bad, that is, permanently inactive. For both blocks 217 and 218, the appropriate flag is set, so that during the next iteration were select 1 is being tested, it may fail with different alphabetic selects, such as A and B. If both A1 and B1 fail, then, due to previous flags being set, A1 failed and therefore select 1 is bad. If only A1 failed and B1 passed, therefore, PWC 501, with an address of A1, is bad. If a PWC has its selects pass the test, the corresponding bits in the table are reset.

Figure 3A:
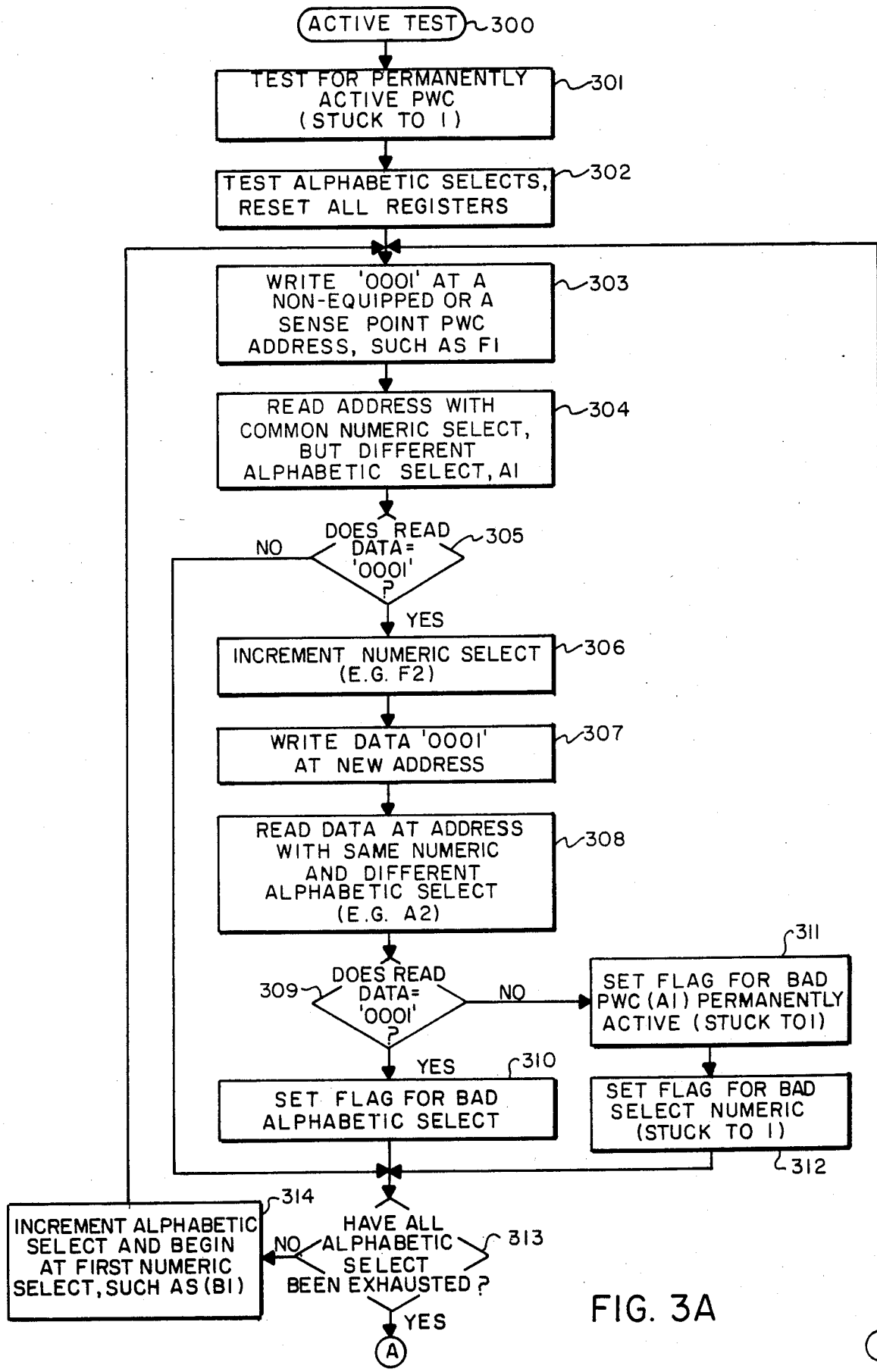
FIGS. 3A and 3B are a logic diagrams of the active testing program of the present invention.
Figure 3B:
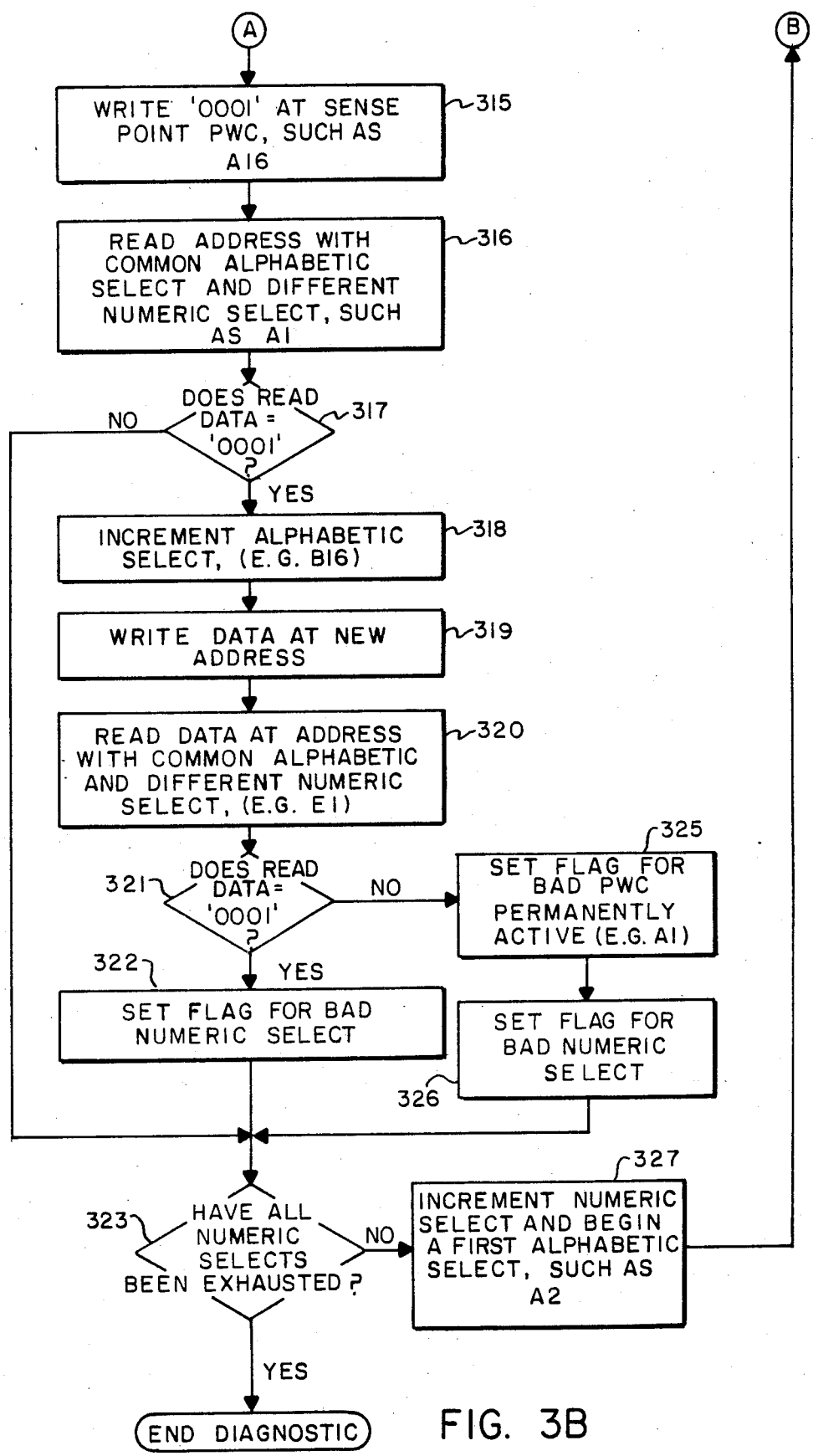

Referring to FIG. 3, when the inactive test has been completed, the active test is initiated 300. This test determines whether printed wiring cards or select signals are permanently active, that is stuck to one, block 301. First, the alphabetic selects are tested. All the registers are reset to 0, 302. The program then writes a logic '0001' at a non-equipped address or at an address which corresponds to a sense point printed wiring card (PWC). A sense point PWC contains read only elements connected to the register and, therefore, cannot be written into by the processor.

An address, such as F1, is selected to be written into with the '0001' pattern. Next, the diagnostic performs a read at an address with a common numeric select, but a different alphabetic select, such as address A1, block 304. The read data is compared the determine whether it is equal to the transmitted data '0001', 305. If the data read is not equal to the test pattern, a transfer is made to block 313. The value of the numeric select is incremented by 1. This will give a new address of F2, for example, 306.

Block 307 then writes the test pattern '0001' at this new address. The data is then read from an address with the same numeric but, a different alphabetic select, such as A2, block 308. The diagnostic then determines whether the data read is equal to the '0001' pattern, block 309. If the data is equal to the test pattern, a flag is set for a bad alphabetic select, block 310. If the data read did not equal the '0001' pattern, then either there is a bad PWC, such as 501, permanently stuck to one; or, select one is stuck permanently active. Both flags are set, so that during an iteration of the process, select 1 is tested for a permanently active condition with different alphabetic selects such as A, B, C, etc for a fault. If, for example, both A1 and B1 fail, due to flags set in previous iterations of the test, select 1 is faulty. If the PWC addressed by A1 failed but, the PWC addressed by B1 passed the test then the PWC addressed by A1 is faulty. This is accomplished by blocks 311 and 312. Block 313 determines whether all alphabetic selects have been tested. If all alphabetic selects have not been tested, the alphabetic selects are incremented by one and the numeric selects begin at 1, block 314. Control is then transferred to iterate the above process at block 303.

When all the alphabetic select have been exhausted, the test pattern '0001' is again written to a sense point PWC, such as A16, block 315. Then, block 316 reads another address with a common alphabetic select and a different numeric select, such as, address A1. Block 317 determines whether the data read is equal to the pattern. If the data read back does not equal the pattern, control is transferred to block 323. If the data read does equal pattern, block 318 increments the alphabetic select to B16, for example.

The '0001' pattern is then written at this new address block 319. Next, block 320 reads the data at an address with a common alphabetic and a different numeric select for example, B1. Block 321 determines whether data read is equal to the pattern. If this test is affirmative, a flag is set for a faulty numeric select block 322 and control is transferred to block 323. If the data read does not equal the pattern, block 325 sets a flag for a faulty PWC permanently active, for example A1. Then, block 326 sets a flag for a faulty numeric select and transfers control to block 323. Block 323 determines whether all the numeric selects have been tested. If the tests of the numeric selects have not been completed, block 327 increments the numeric select and begins at the first alphabetic select, such as A2. Then control is transferred to iterate the above procedure beginning at block 303. If all the numeric selects have been exhausted, then block 324 is entered which terminates the diagnostic. Control is returned from the diagnostic to the calling program. This diagnostic is periodically given control to execute and to build a data table indicating whether PWC's or selects (decodes) are faulty.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. In a processing system including a processor, a plurality of printed wiring cards (PWCs) having a plurality of sense points or control points, an addressing arrangement for selectively enabling said PWCs via a data bus connecting said processor to each said PWC, a diagnostic method for validating the integrity of said addressing arrangement comprising the steps of:

first selecting a first address having first and second address components corresponding to a first particular PWC having a plurality of sense points;

first testing a second PWC corresponding to a second address having a different first address component and an identical second address component as said first address and producing a first valid or a first invalid condition;

second selecting a third PWC corresponding to a third address having an identical first address component and a second address component incremented by one as said first address in response to said invalid first condition;

second testing a fourth PWC corresponding to a fourth address having an identical first address component and a second address component incremented by one as said second address in response to said invalid first condition to produce a second valid or a second invalid condition;

first indicating a fault for said PWC corresponding to said second address and a fault for said second address component of said first address in response to said second valid condition;

second indicating a fault for said first address component of said first address in response to said second invalid condition;

first iterating said steps first and second selecting, first and second testing and first and second indicating with an address having said first address component incremented by one for each said step of first iterating for each of said first address components;

third selecting a fifth address, having first and second address components, corresponding to a fifth PWC having a plurality of sense points;

third testing a sixth PWC corresponding to a sixth address having an identical first address component and second address component incremented by one as said fifth address, said third testing producing a third valid or a third invalid condition;

fourth selecting a seventh PWC corresponding to a seventh address having a first address component incremented by one and a second address component identical to said fifth address in response to said third invalid condition;

fourth testing an eighth address having an identical first address component and a second address incremented by one as said seventh address, said fourth testing producing a fourth invalid condition or a fourth valid condition in response to said third invalid condition;

third indicating a fault for said PWC corresponding to said fifth address and a fault for said first address component of said fifth address in response to said fourth valid condition;

fourth indicating a fault for said second address component of said fifth address in response to said fourth invalid condition; and second iterating said steps of first iterating, third and fourth selecting, third and fourth testing and third and fourth indicating with an address having said second address component incremented by one for each said step of second iterating for each of said second address components.

2. A diagnostic method as claimed in claim 1, wherein there is further included the step of initializing each of said plurality of PWCs.

3. A diagnostic method as claimed in claim 2, said step of first selecting comprising the steps of:

obtaining said first address corresponding to a first particular PWC; and writing a predefined dta word to said second PWC via said data bus.

4. A diagnostic method as claimed in claim 3, said step of first testing comprising the steps of:

reading a data word from said second PWC via said data bus; and comparing said data word read from said second PWC with said predefined data word to produce said first valid condition for a miscomparison of said predefined data word with said read data word or to produce said first invalid condition for a comparison of said predefined data word with said read data word.

5. A diagnostic method as claimed in claim in claim 4, said step of second selecting comprising the steps of:

obtaining said first address;

incrementing said first address component of said first address by one to obtain said second address; and writing said predefined data word to said third PWC.

6. A diagnostic method as claimed in claim 5, said step of second testing comprising the steps of:

reading a data word from said fourth PWC; and comparing said data word read from said fourth PWC with said predefined data word to produce said second valid condition for a miscomparison of said predefined data word with read data word or to produce said second invalid condition for a comparison of said predefined data word with said read data word.

7. A diagnostic method as claimed in claim 6, said step of second indicating including the step of setting a bit in a table corresponding to said first address component of said first PWC as being faulty.

8. A diagnostic method as claimed in claim 7, said step of first indicating comprising the steps of:

setting a bit in said table corresponding to said second PWC as being faulty; and setting a bit in said table corresponding to second address component of said first address as being faulty.

9. A diagnostic method as claimed in claim 8, said step of first iterating comprising the steps of:

determining whether all PWCs with said first address component have been verified and producing a first complete or a first incomplete condition;

incrementing said first address component in response to said first incomplete condition;

repeating said steps of claims 2 through 9 until said first complete condition is obtained.

10. A diagnostic method as claimed in claim 9, said step of third selecting comprising the steps of:

obtaining said fifth address corresponding to said fifth PWC; and writing said predefined data word to said fifth PWC via said data bus.

11. A diagnostic method as claimed in claim 10, said step of third testing comprising the steps of:

reading a data word from said sixth PWC via said data bus; and comparing said data word read from said sixth PWC with said predefined data word to produce said third valid condition for a miscomparison of said predefined data word with said read data word or to produce said third invalid condition for a comparison of said predefined data word with said read data word.

12. A diagnostic method as claimed in claim 11, said step of forth selecting comprising the steps of: obtaining said fifth address;

incrementing said first address component of said fifth address to obtain said seventh address; and writing said predefined data word to said seventh PWC via said data bus.

13. A diagnostic method as claimed in claim 12, said step of fourth testing comprising the steps of:

reading a data word from said eighth PWC via said data bus; and comparing said data word read from said eighth PWC with said predefined data word to produce said fourth valid condition for a miscomparison of said predefined data word with said read data word or to produce said fourth invalid condition for a comparison of said predefined data word with said read data word.

14. A diagnostic method as claimed in claim 13, said step of third indicating comprising the steps of:

setting a bit in said table corresponding to said fifth PWC as being faulty; and setting a bit in said table corresponding to second address component of said fifth PWC as being faulty.

15. A diagnostic method as claimed in claim 14, said step of fourth indicating including the step of setting a bit in a table corresponding to said first addressed component of said fifth PWC as being faulty.

16. A diagnostic method as claimed in claim 15, said step of second iterating comprising the steps of:

determining whether all PWCs with said second address component have been verified and producing a second complete or a second incomplete condition in response to said first complete condition;

incrementing said second address component in response to said second incomplete condition; and repeating said steps of claims 2 through 15 until said second complete condition is obtained.

17. A diagnostic method as claimed in claim 16 wherein there is included the step of terminating said diagnostic method in response to said second complete condition.

18. A diagnostic method as claimed in claim 17 wherein there is further included the step of resetting said bit in said table corresponding to said PWC in response to said first, and said third valid conditions.

* * * * *